United States Patent [19]

Shiomi et al.

[11] Patent Number: 4,897,820

[45] Date of Patent: Jan. 30, 1990

[54] BI-CMOS TYPE OF SEMICONDUCTOR MEMORY DEVICE

[75] Inventors: Toru Shiomi; Kenji Anami, both of Hyogo, Japan

[73] Assignee: Mitsubishi Denki Kabushiki Kaisha, Tokyo, Japan

[21] Appl. No.: 156,432

[22] Filed: Feb. 16, 1988

[30] Foreign Application Priority Data

Aug. 25, 1987 [JP] Japan .............................. 62-210602

[51] Int. Cl.$^4$ .......................................... G11C 11/34
[52] U.S. Cl. ........................... 365/230.08; 365/189.11
[58] Field of Search ........... 365/189, 230, 233, 189.11, 365/230.06, 230.08, 177

[56] References Cited

U.S. PATENT DOCUMENTS

| | | | |
|---|---|---|---|
| 4,369,503 | 1/1983 | Isogai .................................. | 365/189 |
| 4,745,582 | 5/1988 | Fukushi et al. ................. | 365/189 X |
| 4,757,474 | 7/1988 | Fukushi et al. ..................... | 365/189 |

OTHER PUBLICATIONS

IEEE Journal of Solid-State Circuits, "13-ns, 500-m W, 64-kbit ECL RAM Using HI-BICMOS Technology" by K. Ogiue et al., vol. SC-21, No. 5, Oct. 1986, pp. 681-684.

Primary Examiner—Joseph A. Popek
Attorney, Agent, or Firm—Lowe, Price, LeBlanc, Becker & Shur

[57] ABSTRACT

An address buffer decoder comprises n address buffer circuits, a decoder circuit, $2^n$ level converting circuits and $2^n$ driver circuits. Each of the address buffer circuits has an input terminal receiving an address signal of an ECL level. The decoder circuit comprises a plurality of output terminals and a plurality of inverted output terminals in each of the address buffer circuits and a plurality of interconnections. A selecting signal of an "L" level is outputted to one of the plurality of interconnections depending on combinations of address signals inputted to the plurality of address buffer circuits. The selecting signal is converted into a signal of an MOS level by each of the level converting circuits. Current of the signal of the MOS level is amplified by each of the driver circuits. The signal of the MOS level is outputted to a corresponding selecting line.

10 Claims, 4 Drawing Sheets

BI-CMOS TYPE OF SEMICONDUCTOR MEMORY DEVICE

BACKGROUND OF THE INVENTION

1. Field of the Invention

The present invention relates to a semiconductor memory device and more particularly, to a semiconductor memory device comprising a combination of a bipolar and a CMOS (complementary metal oxide semiconductor).

2. Description of the Prior Art

FIG. 1 is a block diagram showing an example of a structure of a random access memory (RAM).

In FIG. 1, a plurality of word lines and a plurality of bit lines are arranged to intersect with each other in a memory cell array 50, memory cells being arranged at intersections of the word lines and the bit lines. A single word line in the memory cell array 50 is selected by an X address buffer decoder 52 and a single bit line in the memory cell array 50 is selected by a Y address buffer decoder 54, so that a memory cell provided at an intersection of the word line and the bit line is selected. Data is written into the selected memory cell or data stored in the memory cell is read out. Writing or reading of data is selected by a read/write control signal R/W applied to an R/W (read/write) control circuit 56. At the time of writing data, input data Din is inputted to the selected memory cell through the R/W control circuit 56. In addition, at the time of reading data, the data stored in the selected memory cell is detected and amplified by a sense amplifier 58, and provided to the exterior as output data Dout through a data output buffer 60.

The RAM generally includes a bipolar RAM comprising a bipolar transistor and an MOS·RAM comprising an MOS transistor. The bipolar RAM is suitable for high-speed operation but consumes much power, so that integration can not be increased. On the other hand, the MOS·RAM is slower in operating speed but consumes less power, as compared with the bipolar RAM, so that high integration can be obtained.

Recently, in order to obtain a large capacity memory capable of performing high-speed operation and having a reduced consumed power, a Bi-CMOS·RAM comprising a combination of a bipolar and a CMOS has been proposed. The Bi-CMOS·RAM is disclosed in, for example, IEEE JOURNAL OF SOLID STATE CIRCUITS, VOL. SC-21, No. 5, October 1986, pp. 681-684. In the Bi-CMOS·RAM, a memory cell array comprises an MOS transistor, and a peripheral circuit such as an address buffer decoder comprises a bipolar transistor or a combination of the bipolar transistor and the MOS transistor.

FIG. 2 is a block diagram showing a structure of an address buffer decoder.

In FIG. 2, a plurality of address terminals 70 are connected to input terminals of a decoder circuit 78 through address buffer circuits 72, level converting circuits 74, and driver circuits 76, respectively.

Each of the address buffer circuits 72 comprises a bipolar ECL (emitter coupled logic) circuit, and an address signal at an ECL level (the potential at an "H" level = −0.9 V and the potential at an "L" level = −1.7 V) is inputted to each of the address terminals 70. Each of the level converting circuits 74 comprises a CMOS, and converts the address signal of the ECL level outputted from each of the address buffer circuits 72 into an address signal of an MOS level (the potential at an "H" level = 0 V and the potential at an "L" level = −4.5 V). Each of the driver circuits 76 comprises a CMOS and a bipolar transistor having high driving ability. The decoder circuit 78 decodes a binary signal comprising a plurality of address signals and applies a selecting signal to one of a plurality of selecting lines 80. Therefore, a memory cell on the selecting line is selected.

According to the above described conventional address buffer decoder, in order to convert a signal of the ECL level into a signal of the MOS level at the high speed in each of the level converting circuits 74, gate capacitance of an MOS transistor receiving the signal must be rapidly charged or discharged. Therefore, current flowing through each of the level converting circuits 74 must be increased, so that consumed power is increased.

SUMMARY OF THE INVENTION

A primary object of the present invention is to provide a semiconductor memory device in which an address signal can be converted from an ECL level to an MOS level at the high speed without increasing consumed power.

The semiconductor memory device according to the present invention comprises a memory cell array including a plurality of MOS memory cells and selecting means for selecting a memory cell in the memory cell array. The selecting means comprises a plurality of address buffer means each comprising a bipolar ECL circuit, decoder means comprising a plurality of outputs, and a plurality of level converting means each connected to a corresponding output of the decoder means.

Each of the address buffer means receives an address signal of an ECL level and outputs the same. The decoder means is responsive to a plurality of address signals of the ECL level outputted from the address buffer means for deriving a selecting signal of the ECL level to one of the outputs. Each of the level converting means converts the selecting signal of the ECL level derived from the decoder means and applies the same to a corresponding memory cell in the memory cell array.

A semiconductor memory device according to another embodiment of the present invention comprises a memory cell array, X selecting means and Y selecting means. The memory cell array comprises a plurality of X selecting lines, a plurality of Y selecting lines arranged to intersect with the X selecting lines, and a plurality of MOS memory cells provided at intersections of the X selecting lines and the Y selecting lines.

The X selecting means comprises a plurality of X address buffer means each comprising a bipolar ECL circuit and receiving an address signal of an ECL level for outputting the same, X decoder means comprising a plurality of outputs and responsive to a plurality of address signals of the ECL level outputted from the X address buffer means for deriving an X selecting signal of the ECL level to one of the outputs, and a plurality of first level converting means each connected to a corresponding output of the X decoder means for converting the X selecting signal of the ECL level derived from the X decoder means into an X selecting signal of an MOS level and applying the same to a corresponding X selecting line in the memory cell array.

The Y selecting means comprises a plurality of Y address buffer means each comprising a bipolar ECL circuit and receiving an address signal of an ECL level for outputting the same, Y decoder means comprising a plurality of outputs and responsive to a plurality of address signals of the ECL level outputted from the Y address buffer means for deriving a Y selecting signal of the ECL level to one of the outputs, and a plurality of second level converting means each connected to a corresponding output of the Y decoder means for converting the Y selecting signal of the ECL level derived from the Y decoder means into a Y selecting signal of an MOS level and applying the same to a corresponding Y selecting line in the memory cell array.

In the semiconductor memory device according to the present invention, the selecting signal of the ECL level is derived from one of the outputs of the decoder means in response to the address signal of the ECL level applied to the address buffer means. The level of the selecting signal is converted into an MOS level by the level converting means, so that a corresponding memory cell is selected by the selecting signal of the MOS level.

According to the semiconductor memory device, since only the selecting signal of the ECL level is converted into the selecting signal of the MOS level at the high speed, only consumed current in the level converting means receiving the selecting signal is increased, so that the current is increased only slightly as a whole.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
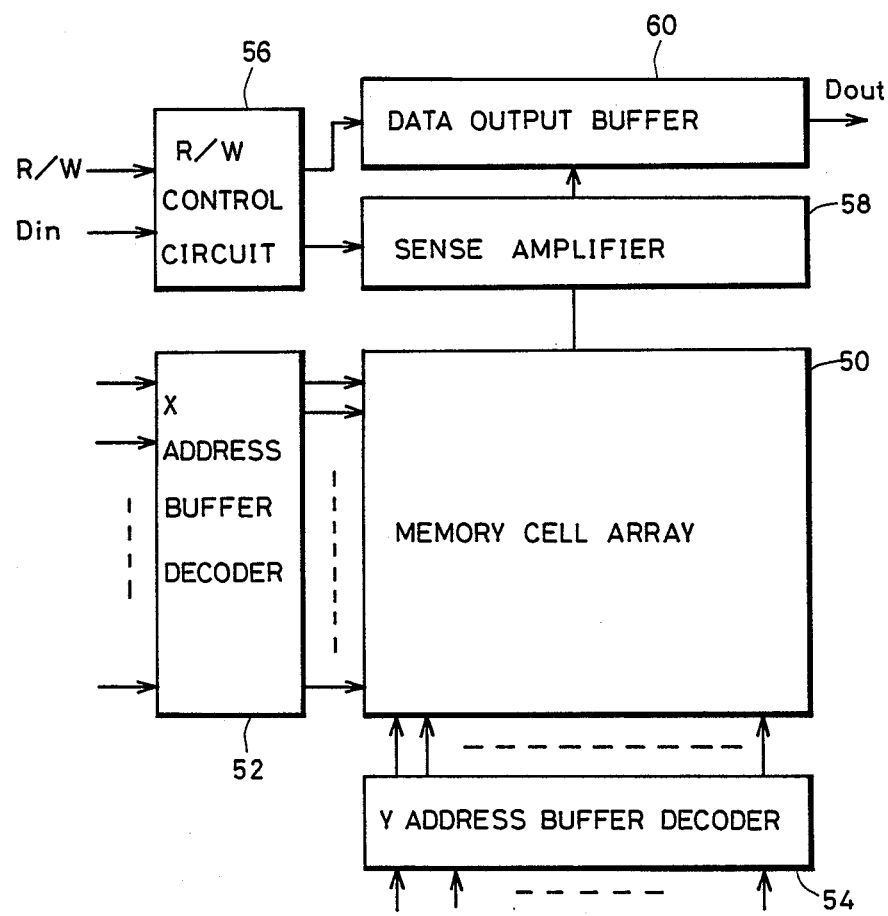
FIG. 1 is a block diagram showing an entire structure of a RAM.
Figure 2:
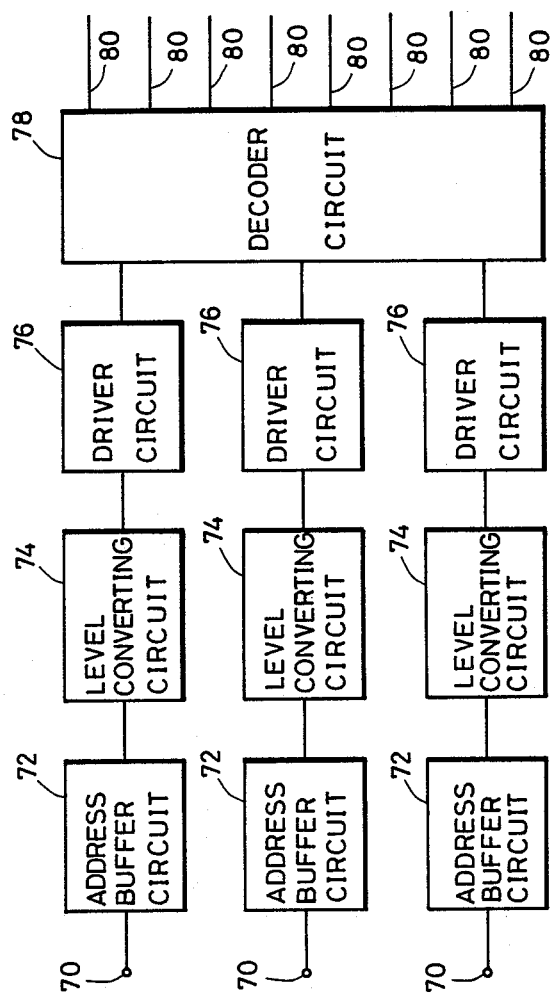
FIG. 2 is a block diagram showing a structure of selecting means in a conventional Bi-CMOS·RAM.
Figure 3:
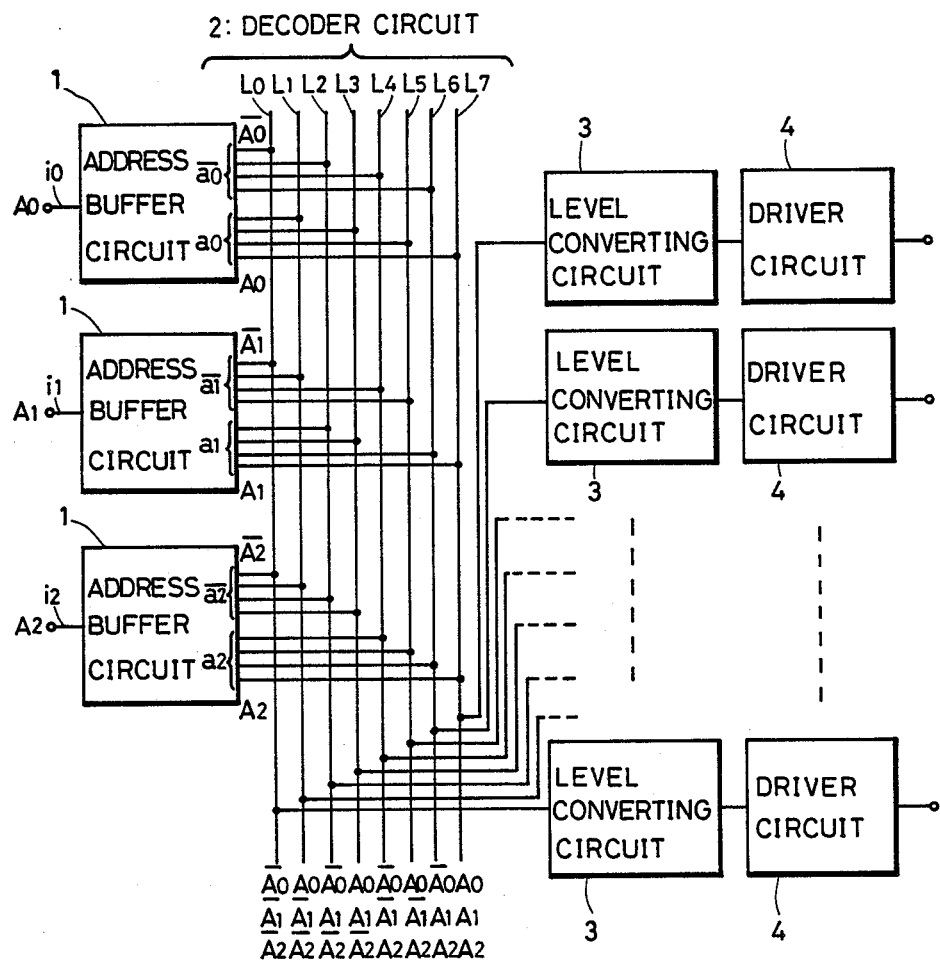
FIG. 3 is a block diagram showing a structure of selecting means in a semiconductor memory device according to an embodiment of the present invention.
Figure 4:
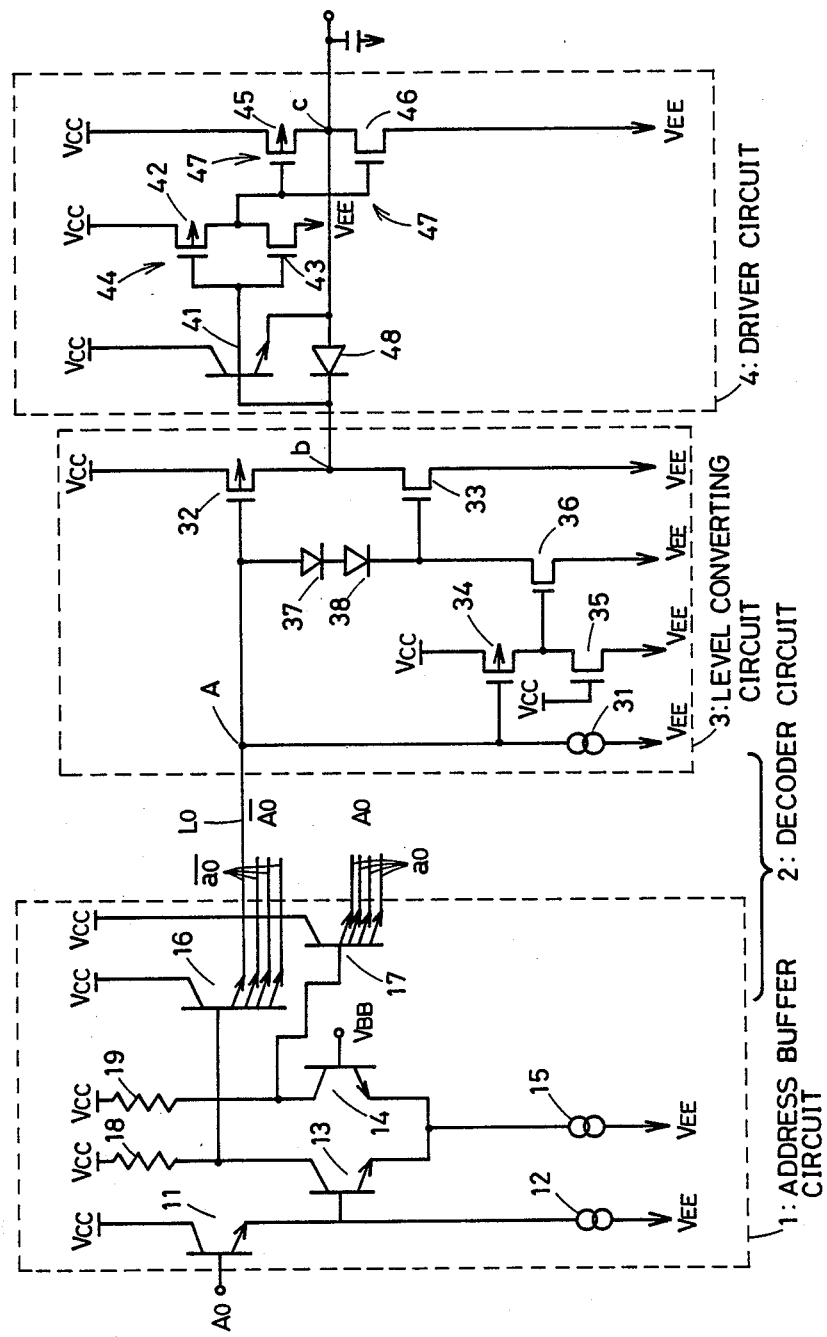
FIG. 4 is a diagram showing a circuit structure of the selecting means according to the present embodiment.

Referring now to FIGS. 3 and 4, description is made on an embodiment of the present invention.

FIG. 3 is a block diagram showing a structure of an address buffer decoder in a Bi-CMOS·RAM according to the present invention.

The address buffer decoder comprises n address buffer circuits 1, a decoder circuit 2, $2^n$ level converting circuits 3, and $2^n$ driver circuits 4. In FIG. 3, the case of $n=3$ is illustrated.

A first address buffer circuit 1 comprises an input terminal $i_0$, four output terminals $a_0$ and four inverted output terminals $\overline{a_0}$. A second address buffer circuit 1 comprises an input terminal $i_1$, four output terminals $a_1$ and four inverted output terminals $\overline{a_1}$. A third address buffer circuit 1 comprises an input terminal $i_2$, four output terminals $a_2$ and four inverted output terminals $\overline{a_2}$. Address signals $A_0$, $A_1$ and $A_2$ of an ECL level are applied to the input terminals $i_0$, $i_1$ and $i_2$, respectively. Signals $A_0$, $A_1$ and $A_2$ of the same logical level as those of the address signals are outputted from the output terminals $a_0$, $a_1$ and $a_2$, respectively, and signals $\overline{A_0}$, $\overline{A_1}$ and $\overline{A_2}$ of the logical level opposite to those of the address signals are outputted from the inverted output terminals $\overline{a_0}$, $\overline{a_1}$ and $\overline{a_2}$, respectively. Each of the respective output terminals $a_0$, $a_1$ and $a_2$ and each of the respective inverted output terminals $\overline{a_0}$, $\overline{a_1}$ and $\overline{a_2}$ in the address buffer circuits 1 are connected to any of eight interconnections L0 to L7. For example, ones of the inverted output terminals $\overline{a_0}$, $\overline{a_1}$ and $\overline{a_2}$ are connected to the interconnection L0, one of the output terminals $a_0$ and ones of the inverted output terminals $\overline{a_1}$ and $\overline{a_2}$ are connected to the interconnection L1, and one of the output terminals $a_1$ and ones of the inverted output terminals $\overline{a_0}$ and $\overline{a_2}$ are connected to the interconnection L2. The connections are of wired OR, in which only when all of the potentials of the output terminals or the inverted output terminals each connected to each of the interconnections L0 to L7 attain an "L" level, the potential of the interconnection attains the "L" level. The decoder circuit 2 is formed by such connections. The potential of only one of the interconnections L0 to L7 attains the "L" level depending on combinations of the address signals $A_0$, $A_1$ and $A_2$ inputted to three address buffer circuits 1, so that the interconnection is selected.

The level converting circuits 3 and the driver circuits 4 are sequentially connected to the interconnections L0 to L7, respectively. Selecting lines are connected to output terminals of the driver circuits 4, respectively, and a plurality of memory cells are connected to each of the selecting lines.

FIG. 4 is a diagram showing a specific circuit structure of the address buffer decoder.

In FIG. 4, a single address buffer circuit 1, a single level converting circuit 3 and a single driver circuit 4 are illustrated.

Description is now made of the address buffer circuit 1. A bipolar transistor 11 has a base coupled to an address signal $A_0$, a collector connected to a power supply potential $V_{CC}$ (0 V) and an emitter connected to a power supply potential $V_{EE}$ ($-4.5$ V) through a constant current source 12. A bipolar transistor 13 has a base connected to the emitter of the bipolar transistor 11 and a collector connected to the power supply potential $V_{CC}$ through a resistor 18. A bipolar transistor 14 has a base coupled to a reference potential $V_{BB}$ and a collector connected to the power supply potential $V_{CC}$ through a resistor 19. Each of the transistors 13 and 14 has an emitter connected to the power supply potential $V_{EE}$ through a constant current source 15.

A first multi-emitter transistor 16 has a base connected to the collector of the bipolar transistor 13. A second multi-emitter transistor 17 has a base connected to the collector of the bipolar transistor 14. Each of the multi-emitter transistors 16 and 17 has a collector connected to the power supply potential $V_{CC}$. Each of the multi-emitter transistors 16 and 17 has emitters, the respective emitters being output nodes $\overline{a_0}$ and $a_0$ in the address buffer circuit 1, and each of the output nodes $\overline{a_0}$ and $a_0$ being connected to any of the interconnections L0 to L7. An output signal $A_0$ of the same logical level as that of the address signal $\overline{A_0}$ is derived to the output node $a_0$, and an output signal $A_0$ of the logical level opposite to that of the address signal $A_0$ is derived to the output node $\overline{a_0}$. In FIG. 4, only the interconnection L0 and the level converting circuit 3 and the driver circuit 4 each connected to the interconnection L0 are illustrated.

Description is now made of the level converting circuit 3. The interconnection L0 is connected to a gate of a PMOSFET (p-channel metal oxide semiconductor field effect transistor) 32 and connected to a power supply potential $V_{EE}$ through a constant current source 31. The PMOSFET 32 has a source connected to a power supply potential $V_{CC}$ and a drain connected to a drain of an NMOSFET (n-channel MOSFET) 33. The NMOSFET 33 has a source connected to the power supply potential $V_{EE}$. A node of the drains of the PMOSFET 32 and the NMOSFET 33 is an output node b. In addition, the gate of the PMOSFET 32 is connected to a gate of the NMOSFET 33 through level shift diodes 37 and 38. The gate of the NMOSFET 33 is connected to the power supply potential $V_{EE}$ through a drain and a source of an NMOSFET 36. A PMOSFET 34 has a gate connected to the interconnection L0, a source connected to the power supply potential $V_{CC}$, and a drain connected to a drain of an NMOSFET 35 and a gate of the NMOSFET 36. The NMOSFET 35 has a gate connected to the power supply potential $V_{CC}$ and a source connected to the power supply potential $V_{EE}$.

Description is now made of the driver circuit 4. The output node b in the level converting circuit 3 is connected to a base of a bipolar transistor 41. The output node b is also connected to an input terminal of a CMOS inverter 44 comprising a PMOSFET 42 and an NMOSFET 43. The CMOS inverter 44 has an output terminal connected to an input terminal of a CMOS inverter 47 comprising a PMOSFET 45 and an NMOSFET 46. The bipolar transistor 41 has a collector connected to a power supply potential $V_{CC}$, and an emitter connected to an output terminal of the CMOS inverter 47 and connected to the output node b in the level converting circuit 3 through an anode and a cathode of a diode 48. The output terminal of the CMOS inverter 47 is an output node c in the driver circuit 4, and a selecting line is connected to the output node c.

Description is now made of operation of the circuit shown in FIG. 4.

It is assumed that the address signal $A_0$ is changed from an "H" level (= −0.9 V) to an "L" level (= −1.7 V). When the address signal $A_0$ applied to the base of the bipolar transistor 11 is changed from the "H" level to the "L" level, the potential of the collector of the bipolar transistor 13 is changed from the "L" level to the "H" level and the collector potential of the bipolar transistor 14 is changed from the "H" level to the "L" level. Therefore, the potential of the emitter of the first multi-emitter transistor 16 is changed from the "L" level to the "H" level and the emitter potential of the second multi-emitter transistor 17 is changed from the "H" level to the "L" level. Thus, the potential of the output node $\overline{a_0}$ attains the "H" level.

The potential of the output node $\overline{a_0}$ at the "H" level equals $V_{CC}-V_{BE}$, and the potential of the output node $\overline{a_0}$ at the "L" level equals ($V_{CC}-V_{BE}$−resistance of the resistor 18 × current flowing through the constant current source 31), where $V_{BE}$ is the voltage (÷0.8 V) between the base and the emitter of the multi-emitter transistor 16. The "L" level is adjusted in advance to a level at which the PMOSFET 32 in the level converting circuit 3 is turned on.

When the potential of the output node $\overline{a_0}$ of the address buffer circuit 1 is changed from the "L" level to the "H" level, the PMOSFETs 32 and 34 are turned off. Since the NMOSFET 35 is always turned on, the potential of the gate of the NMOSFET 36 equals $V_{EE}$, so that the NMOSFET 36 is turned off. Furthermore, the gate potential of the NMOSFET 33 equals about the potential of the output node $\overline{a_0}$. Therefore, the NMOSFET 33 is turned on, so that the potential of the output node b in level converting circuit 3 is changed from the "H" level ($V_{CC}$) to the "L" level ($V_{EE}$). More specifically, the ECL level is converted into the MOS level.

When the potential of the output node b in the level converting circuit 3 is changed from the "H" level to the "L" level, the potential of the output node c in the driver circuit 4 is changed from the "H" level ($V_{CC}$) to the "L" level ($V_{EE}$) by the two CMOS inverters 44 and 47. At the same time, the bipolar transistor 41 is turned off, so that current flows from the output node c to the output node b in the level converting circuit 3 through the diode 48. The current flows to the power supply potential $V_{EE}$ through the NMOSFET 33. As a result, the rising time of the potential of the output node c is advanced.

It is assumed that the address signal $A_0$ is changed from the "L" level (= −1.7 V) to the "H" level (= −0.9 V). When the address signal $A_0$ applied to the base of the bipolar transistor 11 is changed from the "L" level to the "H" level, the collector potential of the bipolar transistor 13 is changed from the "H" level to the "L" level and the collector potential of the bipolar transistor 14 is changed from the "L" level to the "H" level. Therefore, the emitter potential of the first multi-emitter transistor 16 is changed from the "H" level to the "L" level and the emitter potential of the second multi-emitter transistor 17 is changed from the "L" level to the "H" level.

At that time, when the potentials of the output nodes in all of the address buffer circuits 1 connected to the interconnection L0 attain the "L" level, the potential of the interconnection L0 attains the "L" level, so that the interconnection L0 is selected.

When the potential of the interconnection L0 attains the "L" level, the PMOSFET 32 is turned on and the NMOSFET 33 is turned off. Therefore, the potential of the output node b in the level converting circuit 3 is changed from the "L" level ($V_{EE}$) to the "H" level ($V_{CC}$). At the same time, the PMOSFET 34 is turned on. The gate potential of the NMOSFET 36 is determined by the ratio of on-resistances of the PMOSFET 34 and the NMOSFET 35. The ratio of the on-resistances are adjusted in advance such that the NMOSFET 36 is also turned on when the PMOSFET 34 is turned on. Thus, the NMOSFET 36 is turned on.

Current pulled from the output node $\overline{a_0}$ to the power supply potential $V_{EE}$, when the potential of the output node $\overline{a_0}$ in the address buffer circuit 1 attains "L" level, flows to the constant current source 31 and also flows to the NMOSFET 36 through the level shift diodes 37 and 38, so that load capacitance connected to the output node $\overline{a_0}$ is discharged at the high speed. As a result, the potential of the selected interconnection L0 is changed from the "H" level to the "L" level.

When the potential of the output node b in the level converting circuit 3 is changed from the "L" level to the "H" level, the potential of the output node c is changed from the "L" level ($V_{EE}$) to the "H" level ($V_{CC}$) by the two CMOS inverters 44 and 47. At the same time, the bipolar transistor 41 is turned on and current flows from the power supply potential $V_{CC}$ to the output node c, so that the potential of the output node c rises from the "L" level to the "H" level at the high speed.

Therefore, when the potential of the interconnection L0 is changed from the "H" level to the "L" level, much current flows from the gate of the PMOSFET 32 to the power supply potential $V_{EE}$, so that the change of the level from the "H" level to the "L" level can be performed at the higher speed. In this case, since current is increased only in the level converting circuit 3 selected when the potential of the interconnection L0 attains the "L" level and current is not increased in the other level converting circuits which are not selected, consumed current is slightly increased as a whole.

Meanwhile, a lot of memory cells are generally connected to the output node c in the driver circuit 4, so that large load capacitance is added. When the potential of the output node c falls from the "H" level to the "L" level, current flows from the output node c to the diode 48. When the potential of the output node c rises from the "L" level to the "H" level, current flows from the bipolar transistor 41 to the output node c, so that the rising and the falling of the potential of the output node c can be performed at the high speed.

Additionally, the potential of the output node c is fully swung from the $V_{EE}$ level to the $V_{CC}$ level by the CMOS inverter 47.

Although in the above, described embodiment, current increasing means for passing much current through only the input gate A in the selected level converting circuit 3 includes the above described circuit comprising the level shift diodes 37 and 38, the PMOSFET 34 and the NMOSFETs 35 and 36, any means capable of passing much current through only the input gate A in the selected level converting circuit 3 may be used. For example, the NMOSFET 35 may be replaced with a resistor, a transistor or the like, in which case the same effect can be obtained.

As described in the foregoing, according to the present invention, since only a selecting signal of an ECL level derived to one of outputs of decoder means is converted into a selecting signal of an MOS level by level converting means, the selecting signal of the MOS level can be obtained at the high speed without increasing consumed current as a whole, so that the speed of operation is increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising a memory cell array including a plurality of MOS memory cells and selecting means for selecting a memory cell in said memory cell array, said selecting means comprising
   a plurality of address buffer means each comprising a bipolar ECL circuit and receiving an address signal of an ECL level for outputting the same,
   decoder means having a plurality of outputs and responsive to a plurality of address signals of the ECL level outputted from said address buffer means for driving a selecting signal of the ECL level to one of said outputs, and
   a plurality of level converting means each connected to a corresponding output of said decoder means for converting the selecting signal of the ECL level derived from said decoder means into a selecting signal of an MOS level and applying the same to a corresponding memory cell in said memory cell array,
   wherein each of said level converting means comprises MOS circuit means having a pair of opposite conductivity channel MOS transistors connected to said decoder means for providing said selecting signal of an MOS level to said memory cell array.

2. A semiconductor memory device according to claim 1, wherein each of said address buffer means comprises
   an input terminal receiving the address signal of the ECL level,
   a first multi-emitter transistor having a plurality of emitters and responsive to said address signal applied to said input terminal for deriving a signal of the same logical level as that of said address signal to each of said emitters, and
   a second multi-emitter transistor having a plurality of emitters and responsive to said address signal applied to said input terminal for deriving a signal of the logical level opposite to that of said address signal to each of said emitters,
   one of the emitters of said first multi-emitter transistor in each of said address buffer means or one of the emitters of said second multi-emitter transistor therein being connected to each of said output terminals in said decoder means.

3. A semiconductor memory device according to claim 2, wherein each of said level converting means comprises
   an output terminal,
   a first potential source for supplying a potential corresponding to a first logical level,
   a second potential source for supplying a potential corresponding to a second logical level,
   an MOS transistor of a first conductivity channel type connected between said first potential source and said output terminal and having a gate terminal coupled to the selecting signal from said decoder means,
   an MOS transistor of the second conductivity channel type connected between said output terminal and said second potential source and having a gate terminal coupled to the potential of the same logical level as that of the selecting signal from said decoder means, and
   current increasing means responsive to said selecting signal for passing current from the gate terminal of said MOS transistor of the first conductivity channel type to said second potential source.

4. A semiconductor memory device comprising a memory cell array including a plurality of MOS memory cells and selecting means for selecting a memory cell in said memory cell array, said selecting means comprising
   a plurality of address buffer means each comprising a bipolar ECL circuit and receiving an address signal of an ECL level for outputting the same,
   decoder means having a plurality of outputs and responsive to a plurality of address signals of the ECL level outputted from said address buffer means for deriving a selecting signal of the ECL level to one of said outputs, and
   a plurality of level converting means each connected to a corresponding output of said decoder means for converting the selecting signal of the ECL level derived from said decoder means into a selecting signal of an MOS level and applying the same to a corresponding memory cell in said memory cell array, wherein each of said level converting means comprises an output terminal, a first potential source for applying a potential corresponding to a first logical level, a second potential source for supplying a potential corresponding to a second logical level, an MOS transistor of a first conductivity channel type connected between said first potential source and said output terminal and having a gate terminal coupled to the selecting signal from said decoder means, an MOS transistor of the second conductivity channel type connected between said output terminal and said second potential source and having a gate terminal coupled to the potential of the same logical level as that of the selecting signal from said decoder means, and current increasing means responsive to said selecting signal for passing current from the gate terminal of said MOS transistor of the first conductivity channel type to said second potential source.

5. A semiconductor memory device comprising a memory cell array including a plurality of MOS memory cells and selecting means for selecting a memory cell in said memory cell array, said selecting means comprising a plurality of address buffer means each comprising a bipolar ECL circuit and receiving an address signal of an ECL level for outputting the same, decoder means having a plurality of outputs and responsive to a plurality of address signals of the ECL level outputted from said address buffer means for deriving a selecting signal of the ECL level to one of said outputs, and a plurality of level converting means each connected to a corresponding output of said decoder means for converting the selecting signal of the ECL level derived from said decoder means into a selecting signal of an MOS level and applying the same to a corresponding memory cell in said memory cell array, wherein said selecting means further comprises driver circuits each for amplifying current of the output signal from each of said level converting means, each of said driver circuits comprising:

an input terminal coupled to the output signal from said level converting means, an output terminal, a first potential source for applying the potential corresponding to the first logical level, a second potential source for applying the potential corresponding to the first logical level, a CMOS inverter circuit responsive to the signal applied to said input terminal for deriving the potentials of said first and second potential sources to said output terminal, a first semiconductor element for passing current from said first potential source to said output terminal when the signal applied to said input terminal is changed from the second logical level to the first logical level, and a second semiconductor element for passing current from said output terminal to said second potential source when the signal applied to said input terminal is changed from the first logical level to the second logical level.

6. A semiconductor memory device comprising a memory cell array including a plurality of MOS memory cells and selecting means for selecting a memory cell in said memory cell array, said selecting means comprising a plurality of address buffer means each comprising a bipolar ECL circuit and receiving an address signal of an ECL level for outputting the same, decoder means having a plurality of outputs and responsive to a plurality of address signals of the ECL level outputted from said address buffer means for deriving a selecting signal of the ECL level to one of said outputs, and a plurality of level converting means each connected to a corresponding output of said decoder means for converting the selecting signal of the ECL level derived from said decoder means into a selecting signal of an MOS level and applying the same to a corresponding memory cell in said memory cell array, wherein each of said level converting means comprises an output terminal, a first potential source for supplying a potential corresponding to a first logical level, a second potential source for supplying a potential corresponding to a second logical level, an MOS transistor of a first conductivity channel type connected between said first potential source and said output terminal and having a gate terminal coupled to the selecting signal from said decoder means, an MOS transistor of the second conductivity channel type connected between said output terminal and said second potential source and having a gate terminal coupled to the potential of the same logical level as that of the selecting signal from said decoder means, and current increasing means responsive to said selecting signal for passing current from the gate terminal of said MOS transistor of the first conductivity channel type to said second potential source, wherein said current increasing means comprises a one-way conducting device connected between the gate terminal of said MOS transistor of the first conductivity channel type and the gate terminal of said MOS transistor of second conductivity channel type for passing current from the gate terminal of said MOS transistor of the first conductivity channel type to the gate terminal of said MOS transistor of the second conductivity channel type, and a switching element connected between the gate terminal of said MOS transistor of the second conductivity channel type and said second potential source and responsive to said selecting signal to be rendered conductive.

7. A semiconductor memory device, comprising a memory cell array including a plurality of MOS memory cells and selecting means for selecting a memory cell in said memory cell array, said selecting means comprising a plurality of address buffer means each comprising a bipolar ECL circuit and receiving an address signal of an ECL level for outputting the same, decoder means having a plurality of outputs and responsive to a plurality of address signals of the ECL level outputted from said address buffer means for deriving a selecting signal of the ECL level to one of said outputs, and a plurality of level converting means each connected to a corresponding output of said decoder means for converting the selecting signal of the ECL level derived from said decoder means into a selecting signal of an MOS level and applying the same to a corresponding memory cell in said memory cell array, wherein each of said address buffer means comprises an input terminal receiving the address signal of the ECL level, a first multi-emitter transistor having a plurality of emitters and responsive to said address signal applied to said input terminal for deriving a signal of the same logical level as that of said address signal to each of said emitters, and a second multi-emitter transistor having a plurality of emitters and responsive to said address signal applied to said input terminal for deriving a signal of the logical level opposite to that of said address signal to each of said emitters, one of the emitters of said first multi-emitter transistor in each of said address buffer means or one of the emitters of said second multi-emitter transistor therein being connected to each of said output terminals in said decoder means, wherein each of said level converting means comprises an output terminal, a first potential source for supplying a potential corresponding to a first logical level, a second potential source for supplying a potential corresponding to a first logical level, an MOS transistor of a first conductivity channel type connected between said first potential source and said output terminal and having a gate terminal coupled to the selecting signal from said decoder means, an MOS transistor of the second conductivity channel type connected between said output terminal and said second potential source and having a gate terminal coupled to the potential of the same logical level as that of the selecting signal from said decoder means, and current increasing means responsive to said selecting signal for passing current from the gate terminal of said MOS transistor of the first conductivity channel type to said second potential source, wherein said current increasing means comprises a one-way conducting device connected between the gate terminal of said MOS transistor of the first conductivity channel type and the gate terminal of said MOS transistor of second conductivity channel type for passing current from the gate terminal of said MOS transistor of the first conductivity channel type to the gate terminal of said MOS transistor of the second conductivity channel type, and a switching element connected between the gate terminal of said MOS transistor of the second conductivity channel type and said second potential source and responsive to said selecting signal to be rendered conductive.

8. A semiconductor memory device according to claim 6, wherein said one-way conducting device comprises a diode.

9. A semiconductor memory device according to claim 6, wherein said switching element comprises an MOS transistor.

10. A semiconductor memory device comprising a memory cell array, row selecting means and column selecting means, said memory cell array comprising a plurality of row selecting lines, a plurality of column selecting lines arranged to intersect with said row selecting lines, and a plurality of MOS memory cells each provided at intersections of said row selecting lines and said column selecting lines, said row selecting means comprising a plurality of row address buffer means each comprising a bipolar ECL circuit for receiving an address signal of an ECL level and outputting the same, row decoder means comprising a plurality of outputs and responsive to a plurality of address signals of the ECL level outputted from said row address buffer means for deriving a row selecting signal of the ECL level to one of said outputs, and a plurality of first level converting means each connected to a corresponding output of said row decoder means for converting the row selecting signal of the ECL level derived from the row decoder means to a row selecting signal of an MOS level and applying the same to a corresponding row selecting line in said memory cell array, said column selecting means comprising a plurality of column address buffer means each comprising a bipolar ECL circuit and receiving an address signal of the ECL level and outputting the same, column decoder means comprising a plurality of outputs and responsive to a plurality of address signals of the ECL level outputted from said column address buffer means for deriving a column selecting signal of the ECL level to one of said outputs, and a plurality of second level converting means each connected to a corresponding output of said column decoder means for converting the column selecting signal of the ECL level derived from the column decoder means into a column selecting signal of an MOS level and applying the same to a corresponding column selecting line in said memory cell array.

* * * * *